United States Patent [19]
Jiang et al.

[11] Patent Number: 5,831,960
[45] Date of Patent: Nov. 3, 1998

[54] INTEGRATED VERTICAL CAVITY SURFACE EMITTING LASER PAIR FOR HIGH DENSITY DATA STORAGE AND METHOD OF FABRICATION

[75] Inventors: Wenbin Jiang, Phoenix; Paul Claisse, Gilbert; Michael S. Lebby, Apache Junction, all of Ariz.

[73] Assignee: Motorola, Inc., Schaumburg, Ill.

[21] Appl. No.: 895,779

[22] Filed: Jul. 17, 1997

[51] Int. Cl.$^6$ ................................................. G11B 7/00
[52] U.S. Cl. .......................... 369/121; 369/122; 372/45; 372/96
[58] Field of Search .................... 369/121, 122; 372/45, 96, 43, 46, 99, 94

[56] References Cited

U.S. PATENT DOCUMENTS

| | | | |
|---|---|---|---|
| 5,245,622 | 9/1993 | Jewell et al. | 372/45 |
| 5,530,715 | 6/1996 | Sheih et al. | 372/96 |
| 5,548,610 | 8/1996 | Bouadma et al. | 372/99 |

*Primary Examiner*—Tod R. Swann
*Assistant Examiner*—Kim-Kwok Chu
*Attorney, Agent, or Firm*—Eugene A. Parsons

[57] ABSTRACT

An integrated vertical cavity surface emitting laser (VCSEL) pair for use in an optical pickup head for high density optical storage applications and a method of fabrication. The VCSEL pair includes a high power VCSEL capable of emitting a power output of at least 15 mW and a low power VCSEL capable of emitting a power output in a range of 1–4 mW. A phase shift mask is integrated with the high power VCSEL to allow for a 180° shift in light emitted therethrough, thereby creating a reduced focal spot size for high density data write applications. The low power VCSEL emission is focused into a Gaussian beam profile for data read applications. The integrated VCSEL pair is utilized in an optical pickup head capable of high density read and write applications for both CDs and DVDs.

26 Claims, 1 Drawing Sheet

INTEGRATED VERTICAL CAVITY SURFACE EMITTING LASER PAIR FOR HIGH DENSITY DATA STORAGE AND METHOD OF FABRICATION

FIELD OF THE INVENTION

This invention relates to vertical cavity surface emitting lasers and more particularly to an integrated pair of vertical cavity surface emitting lasers for use in high density optical data storage applications.

BACKGROUND OF THE INVENTION

The rapid advancement of multimedia applications requires a system that stores more information more compactly, and is easier to use and handle. Digital video disc (DVD) technology offers this high density format advantage. DVD technology is based on a new generation of a compact disc format which provides for increased storage capacity and performance, especially for video and multimedia applications.

Compact disc (CD) technology has become the global standard for music, entertainment and computer software. Although extremely popular, CD technology has yet been able to provide high density formats. A compact disc (CD) can typically only store approximately five minutes worth of analog image information, and a larger size laser disc of 11.8 inches can store approximately sixty minutes of analog image information. Accordingly, the movie/entertainment and computer industries want to pursue high density formats, such as that found in DVD technology.

As the industry introduces this new digital technology, and other high density optical storage devices, an increasingly important consideration is the beam profile of the pickup head light source and the required focal spot size of the pickup head light source in achieving optimal performance. In general, a high density format disc, such as a DVD disc, has a pit length of 0.41 $\mu$m and a track pitch of 0.74 $\mu$m, almost half that of a CD format disc. During operation of these high density format discs, data reading applications require 1–4 mW of power, while data writing applications require a minimum of 10 mW to operate. Therefore, when utilizing a single mode optical light source, there is a requirement for operation at a higher power.

Typically the focal spot size of a high power spatially multimode output light source is too large to allow for writing data to the high density data storage device. Accordingly, to utilize such high power multimode optical light sources in data writing applications, the focal spot size of the high power light output beam must be reduced in size utilizing a phase shift mask. While such a beam can theoretically be used for both data write and data read applications, the tail of the focused beam can be very wide causing potential cross-talk between neighboring data tracks and bits during data read applications. Accordingly, a single mode VCSEL, with a Gaussian shaped output beam, is preferred for data read applications. While able to operate with minimal potential of cross-talk, it has a limited power level and can not be used for data write applications due to an insufficient power level.

Many light sources can potentially be utilized for these high density read and write applications, such as organic lasers, semiconductor lasers, gas lasers, solid state lasers, or higher mode lasers with the high power light source having at least two lobes that are capable of undergoing a phase shift. Similar high power light sources can be utilized taking into account the necessary adjustments to reduce the focal spot size. In particular, there is a strong desire to utilize a multimode high power VCSEL, such as a donut mode VCSEL and/or first order mode light source that has the required high power output for high density data write applications, and a single mode VCSEL, that operates at a low power for high density data read applications.

It would be highly advantageous to remedy the foregoing high power and low power versus focal spot size challenge and other deficiencies inherent in the prior art. Thus, it is highly desirable and an object of the present invention to provide for a light source, composed of a pair of integrated vertical cavity surface emitting lasers, more particularly a high power VCSEL and a low power VCSEL that share common epitaxial layers. Accordingly, proposed is an integrated light source, including a high power VCSEL, that once having undergone a phase shift, is capable of generating an optical focal spot size of reduced dimension so as to allow for optimal operation in a data write mode. Further included, is the low power VCSEL that operates in a single mode and allows for optimal operation in a data read mode. Accordingly, proposed is a low cost integrated pair of VCSELs to be used for high density optical data storage. The proposed approach should allow two lasers to share the same optical system, and therefore to reduce system size and cost.

Another object of the invention is to provide for a VCSEL having a sufficient output power for data write applications and a VCSEL having a minimal beam thickness for data read applications.

It is yet another object of the present invention to provide for a light source including a high power VCSEL that generates a small focal spot size for the writing of information and a low power VCSEL for the reading of information, to and from high density optical storage devices, such as CDs and DVDs.

Still another object of the present invention is to provide for a method of fabricating an integrated VCSEL pair that allows for high power operation while maintaining reduced focal spot size for optical write applications and low power operation for use in optical read applications.

Yet another object of the invention is to reduce the complexity, thus cost, of a light source used in a high density optical storage pickup head.

SUMMARY OF THE INVENTION

Briefly, to achieve the desired objects of the instant invention in accordance with a preferred embodiment thereof, provided is an integrated vertical cavity surface emitting laser (VCSEL) pair including a high power multimode VCSEL and a low power single mode VCSEL. The VCSEL pair sharing a common substrate element and a portion of a first DBR mirror stack. Each defined VCSEL further including an active layer and a second DBR mirror stack. The high power VCSEL further including an integrated phase shift mask that allows for a 180° phase shift in light emitted therethrough.

In addition, included is a method of fabricating an integrated VCSEL pair for high density optical storage applications including providing a substrate element, disposing a first DBR mirror stack on the substrate element, disposing an active region on the first DBR mirror stack, and disposing a second mirror stack on the active region. A high power VCSEL and a low power VCSEL are formed by etching through to the first DBR mirror stack, thereby defining the integrated VCSEL pair. A one-half wavelength phase shift mask is disposed on the second DBR mirror stack of the defined high power VCSEL. The phase shift mask is integrated with the high power VCSEL and allows for a 180° shift in light passing therethrough prior to focusing into a focal spot by an optical element.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE DRAWINGS

Figure 1:
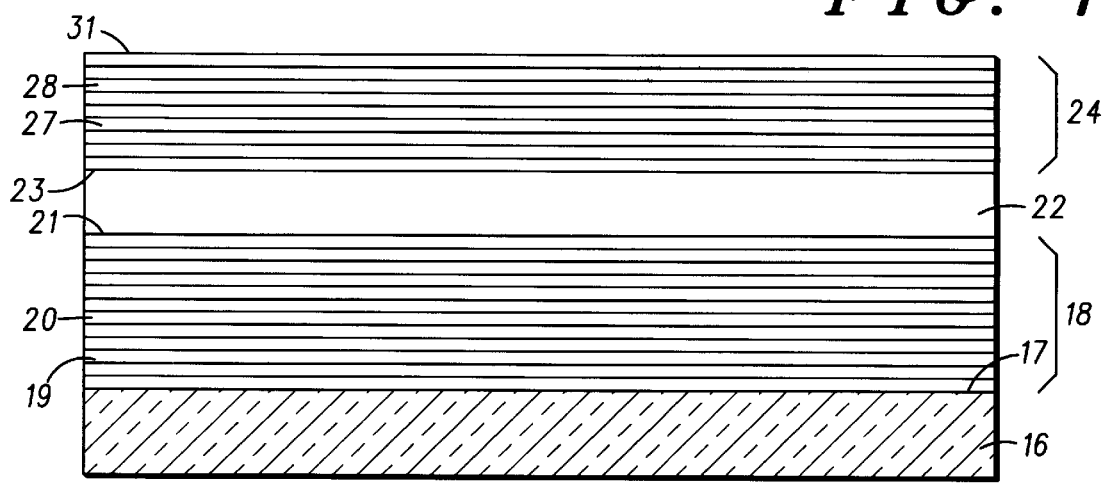
FIG. 1 is a schematic view of an initial growth of a plurality of layers forming the integrated VCSEL pair in accordance with the present invention.
Figure 2:
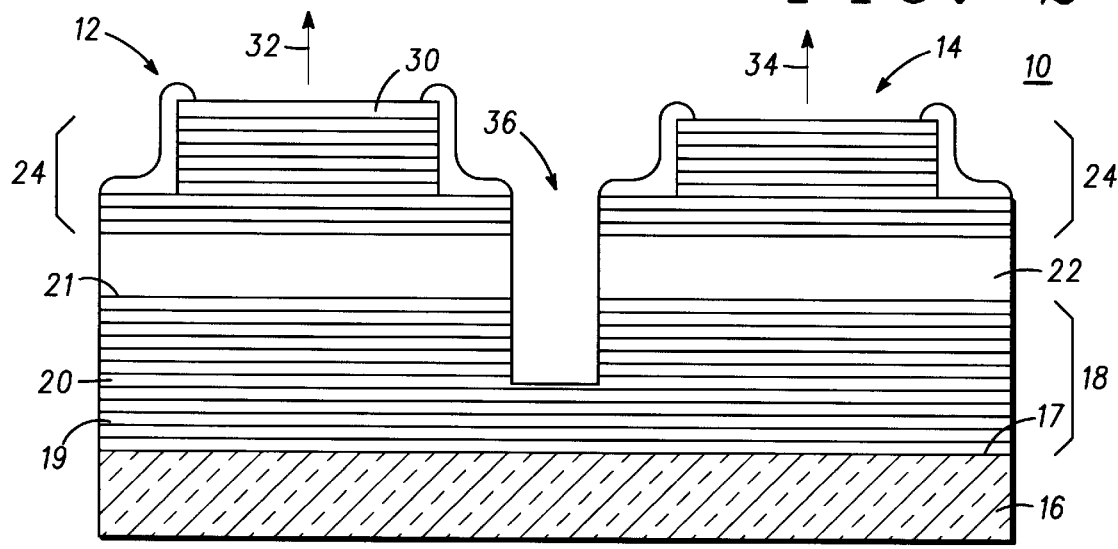
FIG. 2 is a schematic view of an integrated VCSEL pair on a substrate element in accordance with the present invention.

Turning now to the drawings, attention is first directed to FIG. 1 which illustrates an initial growth and/or deposition of a plurality of layers which form the integrated VCSEL pair of the present invention, generally referenced as 10. As illustrated in FIG. 2, integrated VCSEL pair 10 is composed of a high power vertical cavity surface emitting laser (VCSEL) with integrated phase mask 12 and a low power VCSEL 14. Integrated VCSEL pair 10 is formed on a substrate element 16, which in this specific embodiment is gallium arsenide (GaAs). GaAs is preferably used to facilitate lattice matching of the components of integrated VCSEL pair 10 which emit light of a specific wavelength. It should be understood that GaAs is only utilized as an example and other semiconductor materials may be employed as substrate 16.

Referring again to FIG. 1, during fabrication, substrate 16 has an upper surface 17 on which a first stack of distributed Bragg reflectors (DBR), or first mirror stack, 18 is disposed. In this particular embodiment, first mirror stack 18 includes a plurality of mirror pairs in an AlAs/$Al_{0.25}Ga_{0.75}As$ material system, more particularly illustrated are alternating layers of AlAs 19 and AlGaAs 20.

There is disposed on a surface 21 of a last alternating mirror pair of first mirror stack 18, an active region 22 composed of an $Al_{0.12}Ga_{0.88}As/Al_{0.3}Ga_{0.7}As$ material system. Active region 22 includes an active structure (not shown) sandwiched between a first cladding region and a second cladding region (not shown).

First mirror stack 18 is formed by depositing pairs of layers on substrate 16 by some convenient technique such as molecular beam epitaxy (MBE), metal-organic chemical vapor deposition (MOCVD) or sputtering. Approximately 25–40 mirror pairs of this material system are deposited on substrate 16 depending on the difference between the refractive indices of the layers. This material system is capable of providing a difference in indices of refraction between layers 19 and 20 in a range of 0.3 to 0.5. This difference in refractive index is large enough to achieve sufficient reflectance of DBR mirror stack 18. It should be understood that these materials can be grown with excellent quality. Active region 22 includes cladding regions which include one or more layers which may be graded if necessary for better carrier confinement. In this specific embodiment the cladding regions are formed of an $Al_{0.5}Ga_{0.5}As/Al_{0.3}Ga_{0.7}As$ material system.

The active structure of active region 22 would include in this particular embodiment, a quantum well layer (not shown) sandwiched between a plurality of barrier layers. The total thickness of active region 22 being one wavelength of the emitted light or a multiple thereof. The quantum well layer is preferably formed of $Al_{0.12}Ga_{0.88}As$ and the barrier layers are preferably formed of $Al_{0.3}Ga_{0.7}As$. One skilled in the art will understand that more quantum well layers and barrier layers can be used depending upon the application. In this particular embodiment, active region 22 is configured to emit light with a wavelength in a range of approximately 780 nm. It should be understood that by altering the material systems described above, integrated VCSEL pair 10 can be fabricated to emit other wavelengths of light. It should be understood that one such alteration of active region material systems includes active region 22 being formed of an AlGaInP/InGaP material system, thereby emitting light with a wavelength in a range of approximately 630 nm.

Next, a top DBR mirror stack 24 is grown on a surface 23 of active region 22. Mirror stack 24 is formed by depositing pairs of alternating layers 27 and 28 on active region 22, using some convenient technique such as molecular beam epitaxy (MBE), metal-organic chemical vapor deposition (MOCVD), or sputtering. Top mirror stack 24 in this particular embodiment is fabricated from an AlAs/$Al_{0.25}Ga_{0.75}As$ material system and composed of approximately 18–30 mirror pairs. Once DBR mirror stack 24 is fabricated, integrated VCSEL pair 10 is selectively etched to define high power VCSEL 12 and low power VCSEL 14 as illustrated in FIG. 2. More particularly, a selective etch down through a portion of first DBR mirror stack 18 is carried out to allow for the formation of the monolithically integrated VCSEL pair 10, defined by a space 36, therebetween.

Once high power VCSEL 12 and low power VCSEL 14 are defined by selective etching, a one-half wavelength thick silicon nitride (SiN) material, more particularly a one-half wavelength phase shift mask 30, is deposited on a surface 31 of a last alternating mirror pair of mirror stack 24. Alternatively, phase shift mask 30 is composed of a one-half wavelength thick silicon dioxide ($SiO_2$) material, or a combination of a dielectric material, such as TiO, TaO, or the like, and an organic material, such as polyimide, or the like. Phase shift mask 30 is fabricated by depositing the SiN material layer by plasma enhanced chemical vapor deposition (PECVD) techniques, or other deposition methods. The cost of manufacture of high power VCSEL 12 with integrated phase mask 30 is decreased by forming phase shift mask 30 directly on a surface of mirror stack 20, thus forming high power VCSEL 12 with an integrated phase shift mask 30. Further information regarding high power VCSEL devices and the use of phase shift masks can be found in U.S. pending patent application Ser. No. 08/895.781, bearing attorney docket number CR 97-054, entitled, "AN OPTICAL DATA PICKUP HEAD FOR HIGH DENSITY OPTICAL DATA STORAGE APPLICATIONS", simultaneously filed herewith, assigned to the same assignee, and incorporated herein by this reference and U.S. pending patent application Ser. No. 08/895,780, bearing attorney docket number CR 97-069, entitled, "A VERTICAL CAVITY SURFACE EMITTING LASER WITH PHASE SHIFT MASK", simultaneously filed herewith, assigned to the same assignee and incorporated herein by this reference.

High power VCSEL with integrated phase mask 12 is fabricated to emit a coherent first order mode light, designated 32, operating in a H01 or H10 (first order) mode. More particularly, high power VCSEL 12 is fabricated as a donut mode VCSEL, the light 32 emitted characterized as having two lobes and capable of undergoing a 180° phase shift. More particularly, high power VCSEL 12 emits light which is focused into a spot with a central lobe smaller than a Fourier transform limited spot, plus some side lobes, or tail. Low power VCSEL 14 is fabricated to emit single mode light having a Gaussian shaped beam profile, designated 34. Low power VCSEL 14 emits light 34 which is focused into a Fourier transform limited spot having a diameter of approximately one micron.

Figure 3:
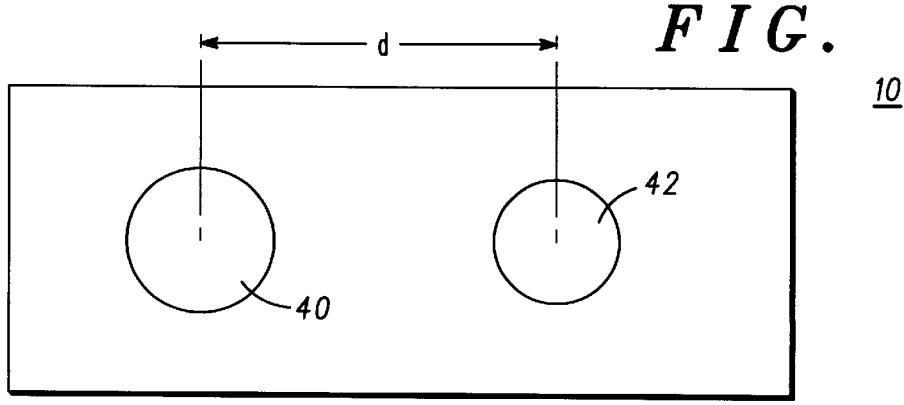
FIG. 3 is a schematic top view of a typical high power VCSEL aperture and an integrated low power VCSEL aperture in accordance with the present invention.

High power VCSEL 12 and low power VCSEL 14 are separated by a space 36 (see FIG. 2), which in this particular embodiment is less than 60 microns. A simplified schematic top view of integrated VCSEL pair 10, more particularly a semiconductor laser chip, showing an aperture 40 for high power VCSEL 12 and an aperture 42 for low power VCSEL 14 is illustrated in FIG. 3. The spacing between the emission of light 32 from high power VCSEL 12 and the emission of light 34 from low power VCSEL 14 in this particular embodiment, as illustrated by high power aperture 40 and low power aperture 42 is less than 100 microns, generally referenced as "d". This spacing allows for operation and proper focus of high power laser emission 32 or low power laser emission 34 dependent upon the reading and/or writing to or from a CD or high density DVD by sharing the same optical lens system. It should be understood that the spacing identified is utilized for purposes of describing this particular embodiment and that the actual spacing between the two devices can be adjusted dependent upon design requirements.

A fundamental mode high output power light source is typically required for proper operation during high density data write applications used in high density optical storage devices, but the first order or higher mode laser beam with appropriate phase shift can perform a similar or better writing function due to the existence of a writing threshold power, especially when a phase-changing material is used as the recording media. Typically at least 10 mW of power is required for data write applications and 1–4 mW of power is required for data read applications. In this particular embodiment, high power VCSEL 12 is fabricated to operate at a power of 15 mW or more and low power VCSEL 14 is fabricated to operate at a power of approximately 1–2 mW. High power VCSEL 12 and low power VCSEL 14 operate dependent upon the active area, the specific ridge size and the current injection applied thereto.

During operation of device 10 in a data write mode, high power donut mode VCSEL 12 emits light having a specific focal point when passing through a high NA lens. As previously stated, in order to operate at optimal performance it is necessary to focus the output beam into a spot equal to or smaller than the Fourier transform limited spot size of a Gaussian mode. To aid in this focusing of the output beam, high power VCSEL 12, as previously stated, includes integrated phase shift mask 30 fabricated as a part thereof (discussed previously).

Phase shift mask 30 is fabricated on laser aperture 40 so as to allow light emitted by VCSEL 12 to pass therethrough phase shift mask 30. As previously stated, phase shift mask 30 is generally composed of a silicon nitride (SiN) material capable of shifting the phase of light emitted therethrough approximately 180°. In general, phase shift mask 30 serves to correct the mode structure of the light emitted therethrough so as to focus it into a focal spot with a strong center lobe and two side lobes after passing through a focal lens. During operation, there is optionally provided either an electrical filter or an optical spatial filter to further filter the two side lobes which can potentially cause cross-talk and interfering noise.

During operation the integrated VCSEL pair 10, more particularly high power VCSEL 12 with integrated phase mask 30 and low power VCSEL 14 are electrically controlled to activate a data read function or a data write function. During the data read function light would be emitted from low power VCSEL 14 operating at a low power level in a range of 1–4 mW, more particularly between 1–2 mW. During the data write function light would be emitted from high power VCSEL 12 with a power level of approximately 15 mW or greater.

In general, light emitted by high power VCSEL 12 undergoes a shift in phase, thus a correction in mode structure, and is focused to provide for a large center lobe and two small side lobes. The center lobe is characterized as being smaller than the focal spot of a Fourier-transform limited Gaussian beam. This allows for optimal performance of an optical pickup head incorporating the semiconductor device 10 in high density data write applications. As previously stated, the side lobes can be electrically or optically filtered to eliminate cross-talk and/or interference during a high density optical write mode. Light emitted by low power VCSEL 14 does not undergo a shift in phase due to operation in a single mode, so as to emit light having a Gaussian beam profile. It should be understood that there may be integrated with low power VCSEL 14 a detector (not shown) for monitoring of the laser emissions. More information regarding the integration of a photodetector with a VCSEL can be found in the following U.S. pending patent applications: (i) Ser. No. 08/673,488, entitled "VERTICAL CAVITY SURFACE EMITTING LASER WITH LATERALLY INTEGRATED PHOTODETECTOR", filed Jul. 1, 1996, assigned to the same assignee, and incorporated herein by this reference; (ii) Ser. No. 08/692,354, entitled "SEMICONDUCTOR LASER PACKAGE WITH POWER MONITORING SYSTEM", filed Aug. 5, 1996, assigned to the same assignee, and incorporated herein by this reference; (iii) Ser. No. 08/719,829, entitled "SEMICONDUCTOR LASER PACKAGE WITH POWER MONITORING SYSTEM AND OPTICAL ELEMENT", filed Sep. 30, 1996, assigned to the same assignee, and incorporated herein by this reference; (iv) Ser. No. 08/829,833, entitled "SEMICONDUCTOR LASER PACKAGE WITH POWER MONITORING SYSTEM", filed Apr. 2, 1996, assigned to the same assignee; and (v) Ser. No. 08/814,532, entitled "SEMICONDUCTOR LASER PACKAGE WITH POWER MONITORING SYSTEM", filed Mar. 10, 1997, assigned to the same assignee, and incorporated herein by this reference.

Thus, disclosed is a semiconductor chip or integrated VCSEL pair including a high power VCSEL and a low power VCSEL. The high power VCSEL with an integrated phase shift mask serves to emit a beam of light characterized as having a higher order Hermite-Gaussian beam profile. The beam of light is utilized for data write applications and is focused into a spot with a central lobe smaller than a Fourier transform limited spot, plus some side lobes, or tails. The low power VCSEL serves to emit a beam of light characterized as having a Gaussian beam profile. The beam of light emitted by the low power VCSEL is focused into a 1 micron diameter Fourier transform limited spot during operation. The semiconductor chip is intended for utilization in an optical pickup head for high density optical storage applications, that can be utilized as a reading and writing head for both CD and DVD applications. This integrated light source allows for a decrease in the complexity of the design and cost of optical pickup heads, due to the decrease in complexity of the light source. In addition, the device of the present invention overcomes the challenges presented in achieving quality high density data read and write results using a VCSEL light source.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated vertical cavity surface emitting laser pair comprising:
    a high power vertical cavity surface emitting laser fabricated on a substrate element; and
    a low power vertical cavity surface emitting laser fabricated on the substrate element and monolithically integrated with the high power vertical cavity surface emitting laser.

2. An integrated vertical cavity surface emitting laser pair as claimed in claim 1 wherein the high power vertical cavity surface emitting laser operates at a power of at least 15 mW.

3. An integrated vertical cavity surface emitting laser pair as claimed in claim 2 wherein the low power vertical cavity surface emitting laser operates in a power range of 1–4 mW.

4. An integrated vertical cavity surface emitting laser pair as claimed in claim 3 wherein the high power vertical cavity surface emitting laser emits a multimode light having a higher order Hermite-Gaussian beam profile that is focused into a spot with a central lobe smaller than a Fourier transform limited spot.

5. An integrated vertical cavity surface emitting laser pair as claimed in claim 4 wherein the low power vertical cavity surface emitting laser emits a single mode light having a Gaussian beam profile that is focused into a Fourier transform limited spot of approximately one micron in diameter.

6. An integrated vertical cavity surface emitting laser pair as claimed in claim 5 wherein the substrate element is a GaAs substrate element.

7. An integrated vertical cavity surface emitting laser pair as claimed in claim 6 wherein the substrate element has formed thereon an uppermost surface, a first DBR (distributed Bragg reflectors) mirror stack.

8. An integrated vertical cavity surface emitting laser pair as claimed in claim 7 wherein the first DBR mirror stack includes alternating layers of an AlAs material and an AlGaAs material.

9. An integrated vertical cavity surface emitting laser pair as claimed in claim 7 wherein the high power vertical cavity surface emitting laser includes an active region disposed on the first DBR mirror stack, and the low power vertical cavity surface emitting laser includes an active region disposed on the first DBR mirror stack.

10. An integrated vertical cavity surface emitting laser pair as claimed in claim 9 wherein the high power vertical cavity surface emitting laser includes a second DBR mirror stack disposed on the active region and the low power vertical cavity surface emitting laser includes a second DBR mirror stack disposed on the active region.

11. An integrated vertical cavity surface emitting laser pair as claimed in claim 10 wherein the active region and the first and second DBR mirror stacks of the high power vertical cavity surface emitting laser and the low power vertical cavity surface emitting laser are configured to emit light with a wavelength in a range of approximately 630 to 780 nm.

12. An integrated vertical cavity surface emitting laser pair comprising:
    a high power multimode vertical cavity surface emitting laser generating an emission along a path; and
    a low power single mode vertical cavity surface emitting laser, monolithically integrated with the high power vertical cavity surface emitting laser and generating an emission along a path.

13. An integrated vertical cavity surface emitting laser pair as claimed in claim 12 wherein the high power multimode vertical cavity surface emitting laser and the low power single mode vertical cavity surface emitting laser are fabricated on a common substrate element having a surface.

14. An integrated vertical cavity surface emitting laser pair as claimed in claim 13 wherein the high power multimode vertical cavity surface emitting laser and the low power single mode vertical cavity surface emitting laser further share a portion of a first DBR (distributed Bragg reflector) mirror stack disposed on the surface of the common substrate element.

15. An integrated vertical cavity surface emitting laser pair as claimed in claim 14 wherein the high power multimode vertical cavity surface emitting laser further includes an active region disposed on a surface of the first DBR mirror stack, a second DBR mirror stack disposed on a surface of the active region, and a phase shift mask disposed on a surface of the second DBR mirror stack.

16. An integrated vertical cavity surface emitting laser pair as claimed in claim 15 wherein the phase shift mask is characterized as shifting the phase of light passing therethrough one-half wavelength.

17. An integrated vertical cavity surface emitting laser pair as claimed in claim 16 wherein the phase shift mask is formed from at least one of a silicon nitride material, a silicon dioxide material, and a dielectric material in combination with an organic material.

18. An integrated vertical cavity surface emitting laser pair as claimed in claim 17 wherein the low power single mode vertical cavity surface emitting laser further includes an active region disposed on a surface of the first DBR mirror stack, and a second DBR mirror stack disposed on a surface of the active region.

19. An integrated vertical cavity surface emitting laser as claimed in claim 18 wherein the low power single mode vertical cavity surface emitting laser is configured to operate at a power level in a range of 1–4 mW and the high power multimode vertical cavity surface emitting laser is configured to operate at a power level of at least 15 mW.

20. An integrated vertical cavity surface emitting laser as claimed in claim 19 wherein the path of emission of the high power multimode vertical cavity surface emitting laser and the path of emission of the low power single mode vertical cavity surface emitting laser are spaced apart approximately 100 microns or less.

21. A method of fabricating an integrated vertical cavity surface emitting laser pair including the steps of:

provimit a substrate having formed thereon a first mirror stack;

disposing an active region and a second mirror stack on the first mirror stack;

selectively etching through the second mirror stack, the active region and a portion of the first mirror stack thereby defining a high power vertical cavity surface emitting laser emitting light along a path and a low power vertical cavity surface emitting laser emitting light along a path separated by a defined space; and disposing on a surface of the second mirror stack of the high power vertical cavity surface emitting laser, a one-half wavelength phase shift mask.

22. A method of fabricating an integrated vertical cavity surface emitting laser pair as claimed in claim 21 wherein the first mirror stack, the active region and the second mirror stack of each of the high power vertical cavity surface emitting laser and the low power vertical cavity surface emitting laser are configured to emit light with a wavelength in a range of approximately 630 to 780 nm.

23. A method of fabricating an integrated vertical cavity surface emitting laser pair as claimed in claim 22 wherein the high power vertical cavity surface emitting laser operates in a donut mode at a power level of at least 15 mW.

24. A method of fabricating an integrated vertical cavity surface emitting laser pair as claimed in claim 23 wherein the low power vertical cavity surface emitting laser operates in a single mode at a power level in a range of 1–4 mW.

25. A method of fabricating an integrated vertical cavity surface emitting laser pair as claimed in claim 24 further including the step of focusing the light emitted by the high power vertical cavity surface emitting laser into a spot with a central lobe smaller than a Fourier transform limited spot.

26. A method of fabricating an integrated vertical cavity surface emitting laser pair as claimed in claim 25 further including the step of focusing the light emitted by the low power vertical cavity surface emitting laser into a one micron in diameter Fourier transform limited spot.

* * * * *